United States Patent
Liao et al.

(10) Patent No.: US 11,773,262 B2
(45) Date of Patent: Oct. 3, 2023

(54) RESIN, COPPER CLAD LAMINATE MADE OF RESIN, AND PRINTED CIRCUIT BOARD

(71) Applicant: A.C.R. TECH CO., LTD., Taipei (TW)

(72) Inventors: Shih-Hao Liao, Taipei (TW); Min-Yuan Yang, Taipei (TW); Ya-Yen Chou, Taipei (TW); Jheng-Hong Ciou, Taipei (TW); Cheng-Chung Chen, Taipei (TW)

(73) Assignee: A.C.R. TECH CO., LTD., Taipei (TW)

( * ) Notice: Subject to any disclaimer, the term of this patent is extended or adjusted under 35 U.S.C. 154(b) by 257 days.

(21) Appl. No.: 16/715,694

(22) Filed: Dec. 16, 2019

(65) Prior Publication Data

US 2020/0263031 A1    Aug. 20, 2020

Related U.S. Application Data

(60) Provisional application No. 62/808,154, filed on Feb. 20, 2019.

(51) Int. Cl.
| | |
|---|---|
| *C08L 71/12* | (2006.01) |
| *B32B 15/20* | (2006.01) |
| *B32B 15/08* | (2006.01) |
| *H05K 1/03* | (2006.01) |
| *H05K 3/02* | (2006.01) |
| *C08G 65/44* | (2006.01) |

(52) U.S. Cl.
CPC ............ *C08L 71/126* (2013.01); *B32B 15/08* (2013.01); *B32B 15/20* (2013.01); *C08G 65/44* (2013.01); *C08L 71/12* (2013.01); *H05K 1/0326* (2013.01); *H05K 3/022* (2013.01); *B32B 2307/204* (2013.01); *B32B 2307/3065* (2013.01); *B32B 2457/08* (2013.01); *C08L 2203/20* (2013.01); *C08L 2205/03* (2013.01)

(58) Field of Classification Search
CPC .... C08L 71/126; C08L 71/12; C08L 2203/20; C08L 2205/03; H05K 3/022; H05K 1/0346; H05K 1/0326; B32B 15/20; B32B 2457/08; B32B 2260/021; B32B 5/26; B32B 15/14; B32B 2250/40; B32B 2307/3065; B32B 2307/30; B32B 2307/302; B32B 2307/204; B32B 2260/046; B32B 2262/101; B32B 7/12; C08G 65/44

See application file for complete search history.

(56) References Cited

U.S. PATENT DOCUMENTS

| | | | |
|---|---|---|---|
| 9,567,481 B2 | 2/2017 | Saito et al. | |
| 9,708,468 B2 | 7/2017 | Kitai et al. | |
| 2008/0171817 A1* | 7/2008 | Peters | C08L 71/126 524/100 |
| 2016/0148719 A1* | 5/2016 | Yin | H01B 3/427 524/119 |
| 2016/0177082 A1* | 6/2016 | Liao | C08J 5/24 428/457 |
| 2017/0174957 A1* | 6/2017 | Kuo | C08G 65/38 |

FOREIGN PATENT DOCUMENTS

| | | | | |
|---|---|---|---|---|
| CN | 111909371 A | * | 11/2020 | |
| KR | 2019004131 A | * | 1/2019 | ............. C08G 65/40 |

OTHER PUBLICATIONS

Machine translation of KR 2019-0004131. (Year: 2019).*

* cited by examiner

*Primary Examiner* — John D Freeman

(74) *Attorney, Agent, or Firm* — Muncy, Geissler, Olds & Lowe

(57) ABSTRACT

A resin comprises at least one compound selected from one of the following formulas (Formula A)

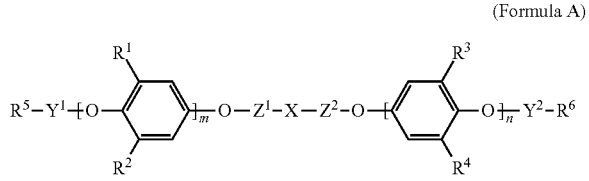

(Formula B)

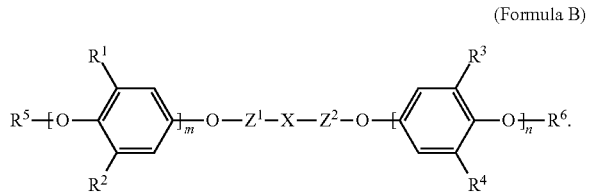

8 Claims, 8 Drawing Sheets

RESIN, COPPER CLAD LAMINATE MADE OF RESIN, AND PRINTED CIRCUIT BOARD

FIELD OF THE INVENTION

The present invention relates to a resin, in particular to a resin applicable to an electronic component.

BACKGROUND OF THE INVENTION

Resins can be divided into thermoplastic resins and thermosetting resins, and the thermoplastic resins refer to high molecular resins which are solid at normal temperature, soften or melt after heating and pressurizing and can flow and take shape after heating and pressurizing, and return to a solid state when cooled, while the above process can occur repeatedly; as for the thermosetting resin, a three-dimensional space solid structure is formed by molecular chain cross-linking, and the thermosetting resin cannot be softened or melted even upon heating and pressurizing. Thus, in the resin manufacturing process, a liquid resin is adopted to be molded into a shape and is reacted with a promoter or a catalyst to form a high-molecular solid with cross-linked molecular chain.

Taking epoxy resin as an example, epoxy resin is widely used in the fields of sports equipment, aerospace industry, medical instruments, and electrical and electronic engineering because of its advantages of high glass transition temperature (Tg), high rigidity, impact resistance, water and chemical resistance, high temperature resistance, low dielectric constant, etc. In particular, in electronic product applications, epoxy resin may be a material for insulation, potting, bonding, and packaging in electronic components such as circuit traces, power converters, and the like. Since epoxy resin is widely applied in many fields, numerous research teams and manufacturers in the relevant field aim to study and develop the properties of epoxy resins, and add additives such as curing agents, flame retardants, etc. to improve the properties of epoxy resins. For example, U.S. Pat. Nos. 9,567,481 and 9,708,468 respectively reveal a resin composition and provide the experiment to prove that the metal-clad laminate, the printed circuit board and other electronic materials manufactured by the resin composition not only have excellent dielectric properties, but also have good flame resistance and heat resistance.

Other substrate materials which are used as the printed circuit board with low dielectric loss also comprise fluorine resin, and yet the substrate material is currently limited to military or aerospace applications due to high cost and difficult processing. In addition, the polyphenylene oxide (PPO) resin is considered as a preferred material of the high-frequency printed circuit board because of good mechanical property and dielectric property; however, the melting viscosity of the PPO resin is too high to be processed and molded into a shape. Besides, the poor solvent resistance of the PPO resin leads to the problem that wires are not firmly attached or would fall off during cleaning in the manufacturing process of the printed circuit board, and the melting point of the PPO resin is similar to the glass transition temperature (Tg), so that it is difficult for soldering tin under a temperature over 250° C. in the manufacturing process of the printed circuit board.

In order to improve the above-mentioned problems, a person skilled in the art mainly attempts to modify the PPO resin to meet the use requirements of a printed circuit board through the following two ways: a crosslinkable reactive group is introduced into the molecular structure of the PPO resin to make the PPO resin become a thermosetting resin; alternatively, a blended thermoset composite is formed by incorporating other thermoset resins by blending modification or interpenetrating network (IPN) techniques. However, due to the different polarity and chemical structures, PPO resins may have defects such as poor compatibility with the reactive groups, thermosetting resins, difficult processing, and loss of good characteristics of PPO resins.

The progress of science and technology is correlative with the development of materials, and the pursuit of better materials to create higher quality products is the main reason for the continuous development and research by those skilled in the art.

SUMMARY OF THE INVENTION

The object of the present invention is to provide a resin, when the resin is applied to the preparation of a substrate material for electronic component or integrated circuit packaging, the substrate material with the resin has the advantages of high glass transition temperature (Tg), excellent dielectric properties, low expansion coefficient, low water absorption, high thermal shock resistance, high thermal conductivity and the like.

In addition to the substrate material used for preparing electronic component or integrated circuit packages, the resin of the present invention is applied to applications such as resin coated copper, adhesives, or powder coating.

To achieve the above object, the present invention provides a resin comprising a compound of the following Formula A:

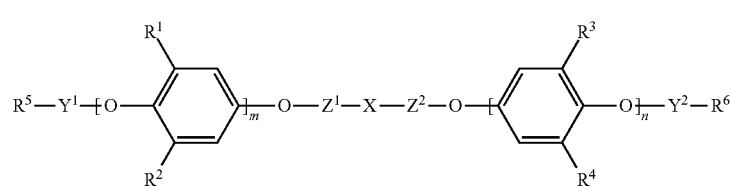

(Formula A)

wherein $Y^1$ and $Y^2$ each independently include

a group comprising an alkenyl group, and a substituted or unsubstituted aromatic ring, or at least include a combination of any of the above;

$R^1$ to $R^4$ each independently include H, a substituted or unsubstituted aromatic ring, a substituted or unsubstituted C1 to C5 alkyl group, and a substituted or unsubstituted C1 to C5 alkenyl group, or at least include a combination of any one of the above;

$Z^1$ and $Z^2$ each independently include a substituted or unsubstituted aromatic ring;

m and n are each independently range from 0 to 100, and m and n are not both 0 at the same time;

$R^5$ and $R^6$ each independently include H,

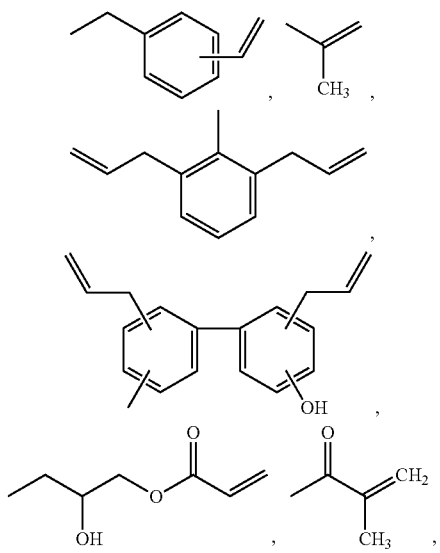

or at least include a combination of any one of the above;
X includes

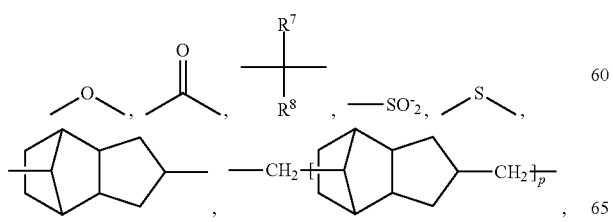

or at least includes a combination of any one of the above, p being a positive integer;

$R^7$ and $R^8$ each independently include H, C1 to C12 alkyl, or $CF_3$, or at least include a combination of any one of the above.

In an embodiment, the compound of Formula A may have a number average molecular weight (Mn) of between 1000 and 15000, a weight average molecular weight (Mw) of between 1000 and 25000, and a Mw/Mn of between 0.067 and 25.

An embodiment further provides a bismaleimide (BMI) resin and a benzoxaine (BZ) resin.

In an embodiment, $Z^1$ and $Z^2$ each independently include:

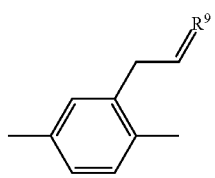

wherein, $R^9$ includes $CH_2$.

To achieve the above object, the present invention further provides a resin comprising a compound of the following Formula B:

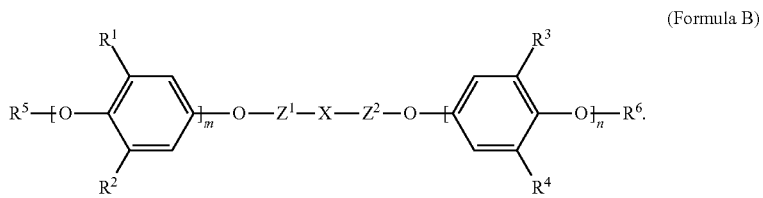

(Formula B)

Wherein $R^1$ to $R^4$ each independently include H, a substituted or unsubstituted aromatic ring, a substituted or unsubstituted C1 to C5 alkyl group, and a substituted or unsubstituted C1 to C5 alkenyl group, or at least include a combination of any one of the above;

$Z^1$ and $Z^2$ each independently include a substituted or unsubstituted aromatic ring;

m and n are each independently a positive integer from 0 to 100, and m and n are not both 0 at the same time;

$R^5$ and $R^6$ each independently include H,

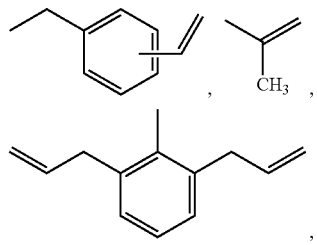

-continued

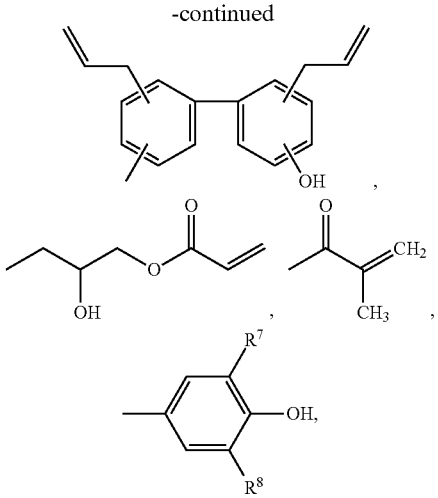

or at least include a combination of any one of the above. X includes

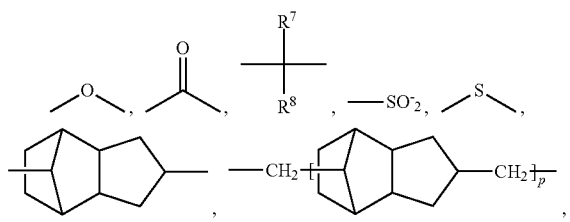

or at least includes a combination of any one of the above, p being a positive integer;

$R^7$ and $R^8$ each independently include H, C1 to C12 alkyl, or $CF_3$, or at least include a combination of any one of the above.

In an embodiment, the compound of Formula B may have a number average molecular weight (Mn) of between 1000 and 15000, a weight average molecular weight (Mw) of between 1000 and 25000, and a Mw/Mn of between 0.067 and 25.

An embodiment further provides a BMI resin and a BZ resin.

In an embodiment, $Z^1$ and $Z^2$ each independently include:

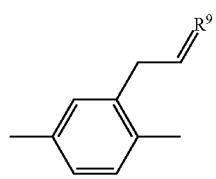

wherein $R^9$ includes $CH_2$.

The present invention further provides a copper clad laminate made of the above resin.

The present invention further provides a printed circuit board that includes the copper clad laminate.

DETAILED DESCRIPTION OF THE PREFERRED EMBODIMENTS

Figure 1:
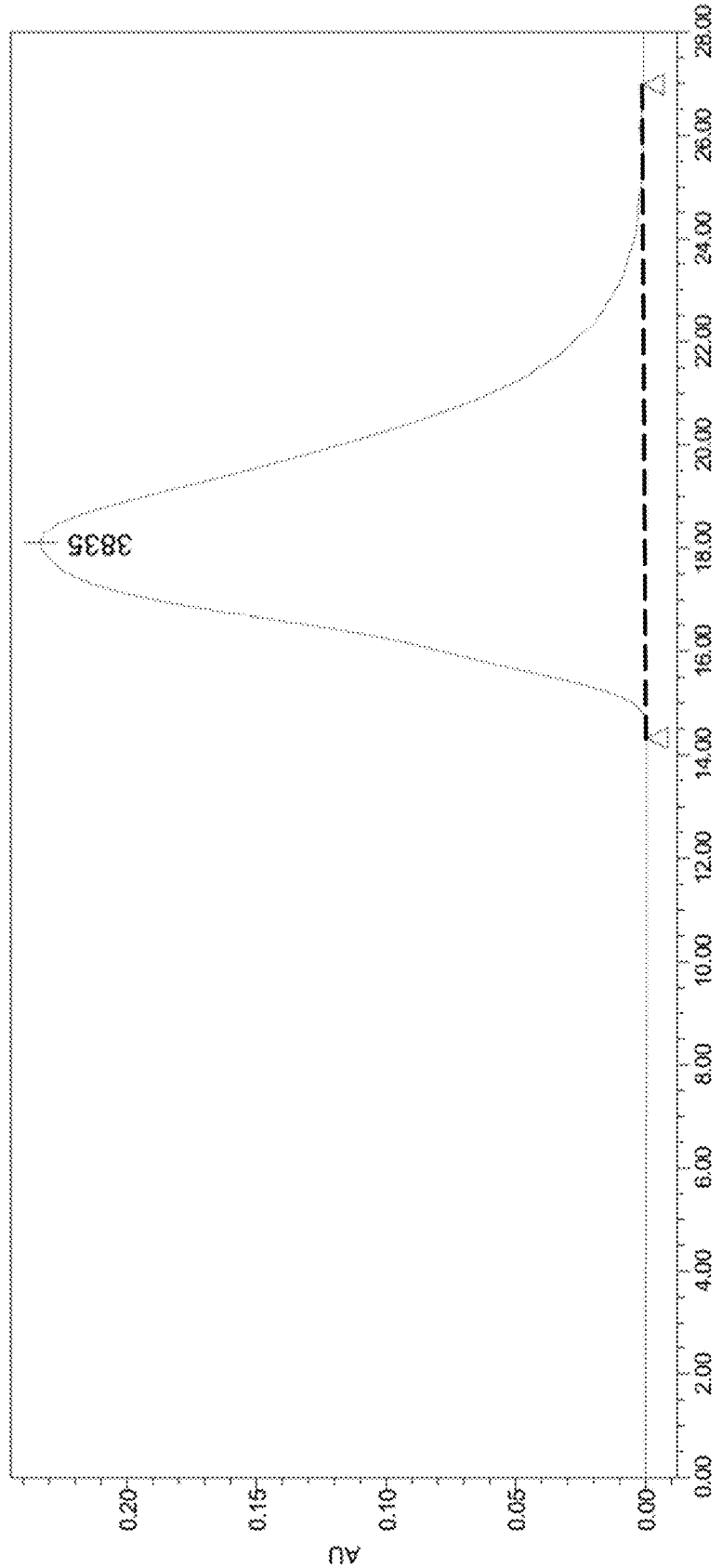
FIG. 1 is a Gel Permeation Chromatography (GPC) analysis result of Synthesis Example 1 of the present invention.

The present invention provides a resin. In an embodiment, the resin is a polyphenylene oxide (PPO), also called polyphenylene ether resin (PPE), such as Formula A or Formula B below. In another embodiment, the resin includes a PPO of Formula A or Formula B and other materials such as a bismaleimide (BMI) resin, a benzoxazine (BZ) resin, and/or other additives. The present invention further provides a copper clad laminate made of the resin, and a printed circuit board including the copper clad laminate.

A compound of Formula A:

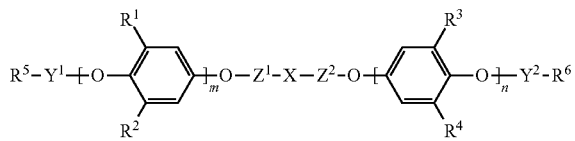

A compound of Formula B:

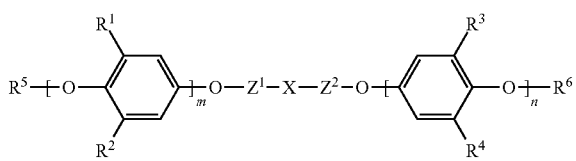

$Y^1$ and $Y^2$ each independently include

a group including an alkenyl group, and a substituted or unsubstituted aromatic ring, or at least include a combination of any of the above. In an embodiment, $Y^1$ and $Y^2$ each independently include an aromatic ring substituted with a methyl group or a C1 to C5 alkenyl group, or an aromatic ring ortho-substituted with a methyl group or a C1 to C5 alkenyl group.

$R^1$ to $R^4$ each independently include H, a substituted or unsubstituted aromatic ring, a substituted or unsubstituted C1 to C5 alkyl group, and a substituted or unsubstituted C1 to C5 alkenyl group, or at least include a combination of any one of the above. In an embodiment, $R^1$ to $R^4$ each independently include an aromatic ring substituted with a methyl group or a C1 to C5 alkenyl group, or an aromatic ring ortho-substituted with a methyl group or a C1 to C5 alkenyl group.

$Z^1$ and $Z^2$ each independently include a substituted or unsubstituted aromatic ring. In an embodiment, $Z^1$ and $Z^2$ each independently include an aromatic ring substituted with a methyl group or a C1 to C5 alkenyl group, or an aromatic ring ortho-substituted with a methyl group or a C1 to C5 alkenyl group.

m and n each independently range from 0 to 100, e.g., from 4 to 12, and m and n are not both 0 at the same time;

$R^5$ and $R^6$ each independently include H,

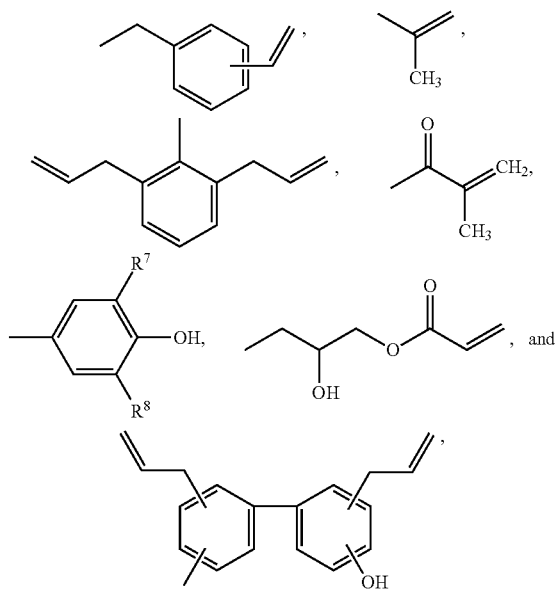

or at least include a combination of any one of the above;

X includes

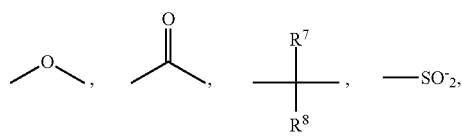

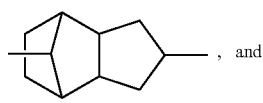

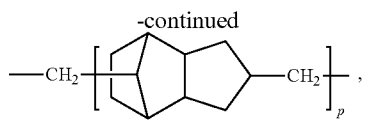

or at least include a combination of any one of the above;

$R^7$ and $R^8$ each independently include H, C1 to C12 alkyl, or $CF_3$, or at least include a combination of any one of the above, p is a positive integer. In an embodiment, p is 1 or 2.

In an embodiment, the compound of Formula A Formula B may include a number average molecular weight (Mn) of between 1000 and 15000, a weight average molecular weight (Mw) of between 1000 and 25000, and a Mw/Mn of between 0.067 and 25.

In order to specifically describe the specific technique of the PPO mentioned in the present invention, please refer to the following examples which are carried out according to the present invention and comparative examples which are carried out by other techniques.

PPO Sample 1

The PPO prepared in the sample 1 is referred to herein as PPO-1a. First, 150 mL of toluene, 0.25 g of copper chloride and 5.3 g of pyridine are added into a one-liter reaction kettle with four necks to prepare a metal composite catalyst.

Subsequently, 36.6 g of 2,6-dimethylphenol and 15.4 g of ortho-diallyl Bisphenol A are prepared as a methanol solution of 2,6-dimethylphenol and ortho-diallyl Bisphenol A at a mass concentration of 50%.

Oxygen is bubbled through and the methanol solution is dropped into the reactor within 20 minutes. The reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Finally, the product is washed with methanol and the filter cake is dried under vacuum at 110° C. for 4 hours to obtain a PPO of Formula 1a shown as below, which has a number average molecular weight (Mn) of about 1000, hereinafter referred to as PPO-1a.

A compound of Formula 1a:

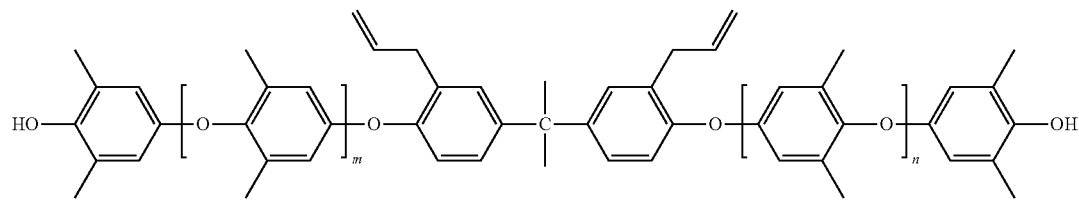

The value of m+n of the chemical formula of PPO-1a approaches 4.

PPO Sample 2

The PPO prepared in the sample 2 is referred to herein as PPO-1b. First, 150 mL of toluene, 0.25 g of copper chloride and 5.3 g of pyridine are added into a one-liter reaction kettle with four necks to prepare a metal composite catalyst.

Subsequently, 54.9 g of 2,6-dimethylphenol and 15.4 g of ortho-diallyl Bisphenol A are prepared as a methanol solution of 2,6-dimethylphenol and ortho-allyl Bisphenol A at a mass concentration of 50%.

Oxygen is bubbled through and the methanol solution is dropped into the reactor within 20 minutes. The reaction is then performed for 120 minutes under a controlled temperature between 30° C. and 35° C. At the end of the reaction, 1.05 g of 36.5 wt % hydrochloric acid is added and stirred for 30 minutes, and then 500 mL of methanol is added for precipitation of a product.

Finally, the product is washed with methanol and the filter cake is dried under vacuum at 110° C. for 4 hours to obtain a PPO of Formula 1b shown as below, which has a number average molecular weight (Mn) of about 2500, hereinafter referred to as PPO-1b.

A compound of Formula 1b:

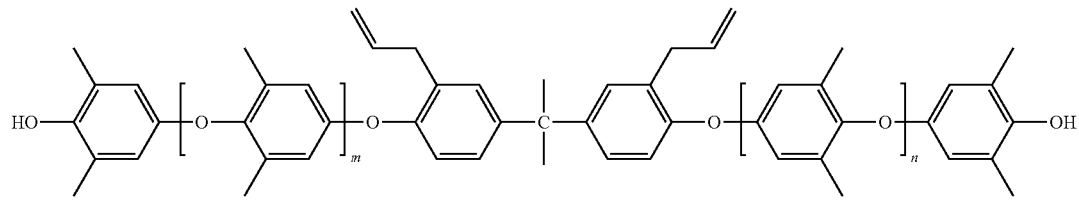

The value of m+n of the chemical formula of PPO-1b approaches 7.

PPO Sample 3

The PPO prepared in the sample 3 is referred to herein as PPO-1c. First, 150 mL of toluene, 0.25 g of copper chloride and 5.3 g of pyridine are added into a one-liter reaction kettle with four necks to prepare a metal composite catalyst.

Subsequently, 85.4 g of 2,6-dimethylphenol and 15.4 g of ortho-diallyl Bisphenol A are prepared as a methanol solution of 2,6-dimethylphenol and ortho-allyl Bisphenol A at a mass concentration of 50%.

Oxygen is bubbled through and the methanol solution is dropped into the reactor within 20 minutes. The reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Finally, the product is washed with methanol and the filter cake is dried under vacuum at 110° C. for 4 hours to obtain a PPO of Formula 1c shown as below, which has a number average molecular weight (Mn) of about 4000, hereinafter referred to as PPO-1c.

A compound of Formula 1c:

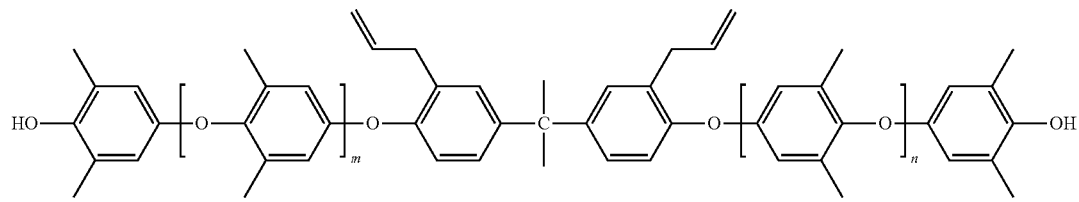

The value of m+n of the chemical formula of PPO-1c approaches 12.

The glass transition temperature Tg of PPO-1a is higher than that of PPO-1b and PPO-1c, and the dielectric property of PPO-1a is slightly lower than PPO-1b and PPO-1c.

The present invention also provides a BZ resin suitable for mixing with PPO. In an embodiment, the chemical formula of the BZ resin is as shown in the following formula 2. In another embodiment, the chemical formula of the BZ resin is as shown in the following formula 3.

A compound of Formula 2:

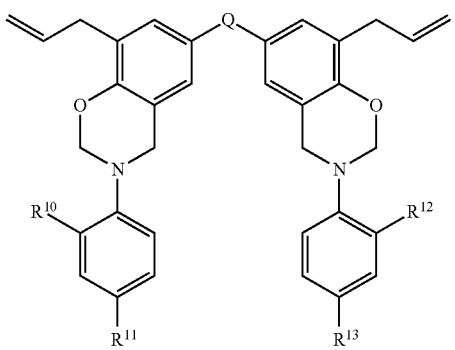

A compound of Formula 3:

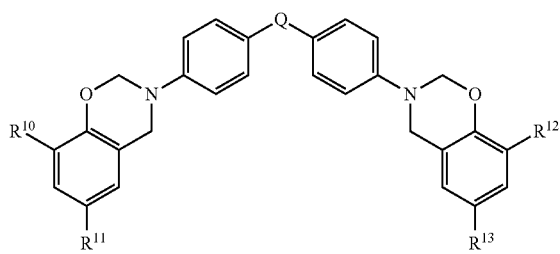

The BZ resin as described in the embodiment is prepared in the following manner: 924 g of ortho-diallyl Bisphenol A, 558 g of aniline and 600 g of toluene are added to a three-liter separable reaction flask with four necks, equipped with a heating device, a thermometer, a stirrer, a cooling tube, a dropping device and a reduced pressure recovery device to form a synthesis solution, and the synthesis solution is warmed to about 40° C. and stirred well.

Under stirring, 819 g of a 44 wt % formaldehyde solution is added dropwise to the synthesis solution within 20 minutes, at which time the temperature of the synthesis solution is raised to about 90° C., and the synthesis solution is heated and maintained at a temperature of about 90° C. and reacted for 3 hours.

Heating and stirring are then stopped and the synthesis solution is stood for about 20 minutes; after the synthesis solution is separated into two layers, the upper aqueous phase and a trace amount of emulsified matter are removed. The solvent is heated to about 90° C. and recovered under reduced pressure of less than about 90 mm Hg, and after the temperature is about 130° C. and all the solvent is recovered, a carbon-oxygen heterocyclic compound with the weight of about 1596 g is obtained. The product is referred to as BZ-2 and is one of the embodiments of the compound of formula 2. In the embodiment of BZ-2, Q corresponding to Formula 2 is —C(CH$_3$)$_2$—, and the positions corresponding to R$^{10}$, R$^{11}$, R$^{12}$, and R$^{13}$ are hydrogen atoms. The reaction corresponding is as follows:

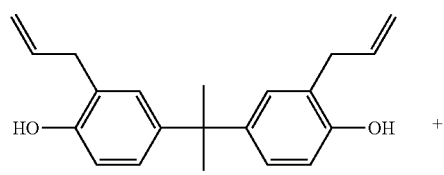

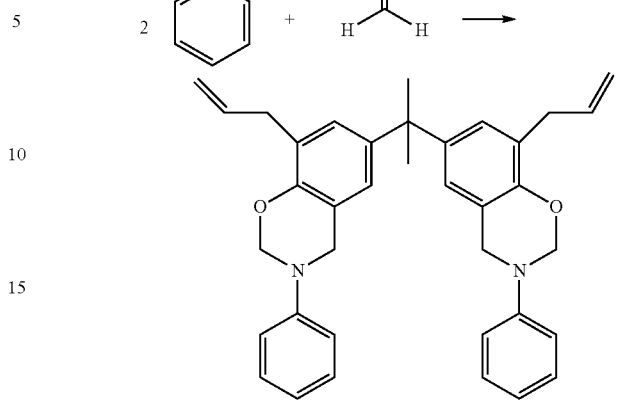

When the composition of the above synthesis solution is changed, 804 g of o-propenyl phenol, 594 g of diaminodiphenylmethane (MDA) and 600 g of toluene are added to a three-liter separable reaction flask with four necks, equipped with a heating device, a thermometer, a stirrer, a cooling tube, a dropping device and a reduced pressure recovery device to form a synthesis solution. The synthesis solution is warmed to about 40° C. and stirred well.

Under stirring, 819 g of a 44 wt % formaldehyde solution is added dropwise to the synthesis solution within 20 minutes, at which time the temperature of the synthesis solution is raised to about 90° C., and the synthesis solution is heated and maintained at a temperature of about 90° C. and reacted for 3 hours.

Heating and stirring are then stopped and the synthesis solution stood for about 20 minutes; after the synthesis solution is separated into two layers, the upper aqueous phase and a trace amount of emulsified matter are removed. The solvent is heated to about 90° C. and recovered under reduced pressure of less than about 90 mm Hg; and after the temperature is about 130° C. and all the solvent is recovered, another carbon-oxygen heterocyclic compound with the weight of about 1528 g is obtained. The product is referred to as BZ-1 and is one of the embodiments of the compound of Formula 3. The reaction formula is as follows:

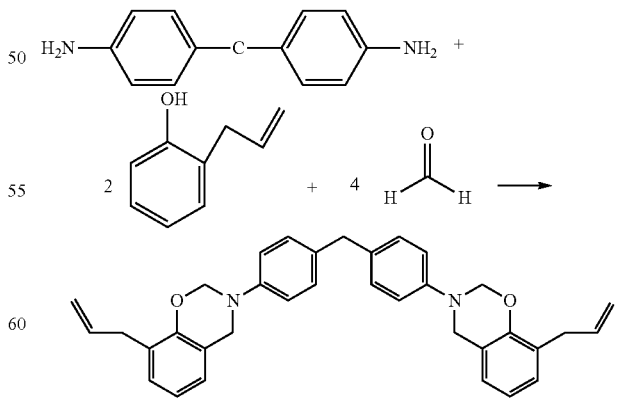

In the embodiment of BZ-1, Q corresponding to Formula 3 is —CH$_2$; the positions corresponding to R$^{10}$ and R$^{12}$ are propenyl, and the positions corresponding to R$^{11}$ and R$^{13}$ are hydrogen atoms. However, $R^{10}$, $R^{11}$, $R^{12}$, and $R^{13}$ in Formula 3 are not limited to the above-described combinations with substituent, for instance, at least one of $R^{10}$, $R^{11}$, $R^{12}$, and $R^{13}$ is a functional group reactive with the double bond of a PPO, and $R^{10}$, $R^{11}$, $R^{12}$, and $R^{13}$ in formula 3 may also be other functional groups such as vinyl, ethyl, and the like are also suitable.

The preparation method of the BZ resin mentioned by the present invention above is not limited in the present invention.

In order to specifically describe the technology of the present invention, a substrate prepared by using PPO-1a, PPO-1b, and PPO-1c according to the present invention is taken as an example, which is then compared with other comparative examples. In the comparative examples, a PPO resin from Sabic Company under the product name MX9000, and a PPO resin from Mitsubishi Gas Chemical Co., Inc., under the product name OPE-2ST are used. Tables 1 and 2 show the formulations of the different examples (Examples 1 to 12), while Table 3 shows the formulations of the different comparative examples (Comparative Examples 1 to 4).

In the following tables, the BMI-1 is m-phenylene-bis-maleimide resin, and BMI-2 is 4,4'-bismaleimidodiphenyl methane, both available from K.I Chemical. Regarding toughening agents, Ricon® 150 is a polybutadiene homopolymer available from Cray valley, and Ricon® 181 is a butadiene styrene random copolymer available from Cray valley. The benzoyl peroxide (BPO) is used as the catalyst (hardener). Regarding flame retardant, OP-935 is an organic hypophosphinate-based compound from Clariant, and FP-100 is a cyclic phenoxyphosphazene available from Fushimi Pharmaceutical Co., Ltd.

In terms of the process, the formulations described in Examples 1 to 12 and Comparative Examples 1 to 4 are first stirred and mixed by a stirrer at room temperature, and a resin is obtained after about 60 minutes to 120 minutes. A roll of glass fiber cloth passes through a series of rollers and enters a gluing tank filled with the resin. After the glass fiber cloth is sufficiently soaked with the resin, excess resin is scraped off by a metering roller and enters a gluing furnace to be dried so as to evaporate the solvent and cause the resin to be semi-solidified, and the glass fiber cloth is cut into a prepreg material after being cooled.

After a certain number of prepreg materials are stacked, an electrolytic copper foil is arranged at the uppermost part and the lowermost part of the stacked prepreg materials. The temperature is increased from 80° C. to 200° C. within 30 minutes under the pressure of 40-900 psi in a vacuum air compressor, and the prepreg materials with electrolytic copper are hot-pressed in 200° C. for 120 minutes and then cooled to room temperature, a double-sided copper clad laminate is produced.

Tests of water absorption, solder resistance, flame resistance, bond strength, glass transition temperature (Tg), dielectric constant (Dk) and dissipation factor (Df) are conducted for the double-sided copper clad laminate obtained in Examples 1 to 12 and Comparative Examples 1 to 4 by the above process, with the results shown in Tables 4 to 6 below.

Water absorption is obtained through the pressure cooker test (PCT) by placing the double-sided copper clad laminate in a pressure vessel at 121° C., under a condition at relative humidity of 100% and 1.2 atm for two hours, thereby testing the moisture resistance of the double-sided copper clad laminate. Solder ability is measured according to the method described in IPC-TM-650 2.4.23. The copper clad laminate is placed in a tin furnace with a constant temperature of 288° C. for 10 seconds, then taken out, immersed in the tin furnace for 10 seconds, and then taken out. The operation is repeated to test the total number of times the copper clad laminate with no delamination according to the heat resistant thereof.

The flame-retardant test is performed according to the UL 94 specification method; the results are expressed as V-0, V-1, V-2 ratings, wherein V-0 represents the best flame resistance and V-2 represents the worst flame resistance. The measurement of bond strength refers to the amount of force required when the copper clad laminate in ⅛ inch is vertically torn.

The glass transition temperature (Tg) is measured by using a dynamic thermomechanical analyzer (DMA) with the method as described in IPC-TM-650 2.4.24.4. The dielectric constant (Dk) and dissipation factor (Df) are measured by placing each copper clad laminate at room temperature and a frequency of 10 GHz using a microwave dielectrometer (AET Co., Japan) according to the method described in JIS C2565. As the dielectric constant (DK value) decreases, the dissipation factor (Df value) is also decreased, and therefore the dielectric properties of the copper clad laminate have greater performance. The difference in Dk value being less than 0.05 represents no significant difference in dielectric constants between the copper clad laminates, while the difference in Dk value greater than 0.05 represents a significant difference in dielectric constants between different copper clad laminates. The difference in Df value less than 0.0005 represents no significant difference in dissipation factors between the copper clad laminates, and vice versa, the difference in Df value greater than 0.0005 represents a significant difference in dissipation factors between different copper clad laminates.

TABLE 1

(Unit: g)

| | | Example | | | | | |
|---|---|---|---|---|---|---|---|
| | | 1 | 2 | 3 | 4 | 5 | 6 |
| PPO | PPO-1a | 60 | — | — | 60 | 60 | 60 |
| | PPO-1b | — | 60 | — | — | — | — |
| | PPO-1c | — | — | 60 | — | — | — |
| BMI | BMI-1 | 10 | 10 | 10 | 10 | — | — |
| | BMI-2 | — | — | — | — | 10 | 10 |
| BZ | BZ-1 | 30 | 30 | 30 | — | 30 | — |
| | BZ-2 | — | — | — | 30 | — | 30 |
| Toughening | Ricon ®150 | 10 | 10 | 10 | — | 10 | 10 |
| agent | Ricon ®181 | — | — | — | 10 | 5 | 5 |
| Catalyst (hardener) | BPO | 0.5 | 0.5 | 0.5 | 0.5 | 0.5 | 0.5 |
| Filler | SiO$_2$ | 35 | 35 | 35 | 35 | 35 | 35 |
| Flame | OP-935 | 5 | 5 | 5 | 5 | 10 | 10 |
| retardant | FP-100 | 10 | 10 | 10 | 10 | 10 | 10 |

TABLE 2

(Unit: g)

| | | Example | | | | | |
|---|---|---|---|---|---|---|---|
| | | 7 | 8 | 9 | 10 | 11 | 12 |
| PPO | PPO-1a | 30 | 30 | — | — | — | — |
| | PPO-1b | — | — | 30 | 30 | — | — |
| | PPO-1c | — | — | — | — | 30 | 30 |
| | MX-9000 | 30 | — | 30 | — | 30 | — |
| | OPE-2ST | — | 30 | — | 30 | — | 30 |

TABLE 2-continued (Unit: g)

| | | Example | | | | | |
|---|---|---|---|---|---|---|---|
| | | 7 | 8 | 9 | 10 | 11 | 12 |
| BMI | BMI-1 | 15 | 15 | 15 | 15 | 15 | 15 |
| | BMI-2 | — | — | — | — | — | — |
| BZ | BZ-1 | 30 | 30 | 30 | 30 | 30 | 30 |
| | BZ-2 | — | — | — | — | — | — |
| Toughening | Ricon ®150 | 10 | 10 | 10 | 10 | 10 | 10 |
| agent | Ricon ®181 | 5 | 5 | 5 | 5 | 5 | 5 |
| Catalyst (hardener) | BPO | 0.5 | 0.5 | 0.5 | 0.5 | 0.5 | 0.5 |
| Filler | SiO$_2$ | 35 | 35 | 35 | 35 | 35 | 35 |
| Flame retardant | OP-935 | 10 | 10 | 10 | 10 | 10 | 10 |
| | FP-100 | 10 | 10 | 10 | 10 | 10 | 10 |

TABLE 3

(Unit: g)

| | | Comparative Example | | | |
|---|---|---|---|---|---|
| | | 1 | 2 | 3 | 4 |
| PPO | MX-9000 | 60 | — | 60 | — |
| | OPE-2ST | — | 60. | — | 60 |
| BMI | BMI-1 | 10 | 10 | — | — |
| | BMI-2 | — | — | — | — |
| BZ | BZ-1 | — | — | 30 | 30 |
| | BZ-2 | — | — | — | — |
| Toughening | Ricon ®150 | 10 | 10 | 10 | 10 |
| agent | Ricon ®181 | — | — | — | — |
| Catalyst (hardener) | BPO | 0.5 | 0.5 | 0.5 | 0.5 |
| Filler | SiO$_2$ | 35 | 35 | 35 | 35 |
| Flame retardant | OP-935 | 10 | 10 | 10 | 10 |
| | FP-100 | 10 | 10 | 10 | 10 |

TABLE 4

| | Example | | | | | |
|---|---|---|---|---|---|---|
| | 1 | 2 | 3 | 4 | 5 | 6 |
| Water absorption (%) | 0.45 | 0.43 | 0.41 | 0.39 | 0.42 | 0.39 |
| Solder resistance (min) | >10 | >10 | >10 | >10 | >10 | >10 |
| Flame resistance (UL) | V-0 | V-0 | V-0 | V-0 | V-0 | V-0 |
| Bond strength (lbs/in) | 5.1 | 4.6 | 4.3 | 4.3 | 4.6 | 4.5 |
| Tg(° C.) | 202 | 198 | 192 | 189 | 184 | 186 |
| Dk | 3.54 | 3.58 | 3.62 | 3.46 | 3.47 | 3.45 |
| Df | 0.006-0.007 | 0.006-0.007 | 0.006-0.007 | 0.006-0.007 | 0.005-0.006 | 0.005-0.006 |

TABLE 5

| | Example | | | | | |
|---|---|---|---|---|---|---|
| | 7 | 8 | 9 | 10 | 11 | 12 |
| Water absorption (%) | 0.41 | 0.38 | 0.42 | 0.43 | 0.45 | 0.43 |
| Solder resistance (min) | >10 | >10 | >10 | >10 | >10 | >10 |
| Flame resistance (UL) | V-0 | V-0 | V-0 | V-0 | V-0 | V-0 |
| Bond strength (lbs/in) | 4.8 | 4.6 | 4.2 | 4.4 | 4.2 | 4.3 |
| Tg(° C.) | 203 | 207 | 198 | 201 | 198 | 203 |
| Dk | 3.46 | 3.47 | 3.52 | 3.48 | 3.58 | 3.52 |
| Df | 0.005-0.006 | 0.005-0.006 | 0.005-0.006 | 0.005-0.006 | 0.005-0.006 | 0.005-0.006 |

TABLE 6

| | Comparative Example | | | |
|---|---|---|---|---|
| | 1 | 2 | 3 | 4 |
| Water absorption (%) | 0.48 | 0.49 | 0.43 | 0.42 |
| Solder resistance (min) | >10 | >10 | >10 | >10 |
| Flame resistance (UL) | V-0 | V-0 | V-0 | V-0 |
| Bond strength (lbs/in) | 3.6 | 3.3 | 3.4 | 3.2 |
| Tg(° C.) | 184 | 182 | 172 | 170 |
| Dk(10 GHz) | 3.47 | 3.48 | 3.42 | 3.43 |
| Df(10 GHz) | 0.005-0.006 | 0.005-0.006 | 0.005-0.006 | 0.005-0.006 |

As shown in Tables 4, 5, and 6, the substrate made of PPO-1a, PPO-1b, and PPO-1c according to the present invention shows excellent performances in water absorption, solder resistance, and flame resistance, and is even more excellent in the characteristics of bond strength, Tg (° C.), dielectric constant (Dk), and dissipation factor (Df).

Other synthetic reactions are exemplified below for the PPO disclosed in the present invention.

Synthesis Example 1

The PPO prepared in this synthesis example is referred to herein as PPO-2a. 150 mL of toluene, 0.25 g of copper chloride and 5.3 g of pyridine are added into a one-liter reaction kettle with four necks to prepare a metal composite catalyst.

59.8 g of 2,6-dimethylphenol and 10.8 g of 2,2'-diallyl bisphenol A are prepared as a methanol solution at a mass concentration of 50%.

Oxygen is bubbled through, and the reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Finally, the product is washed with methanol and the filter cake is dried under vacuum at 110° C. for 4 hours to obtain 61 g of a PPO powder of the following formula 2a. According to a Gel Permeation Chromatography (GPC) analysis result shown in FIG. 1, the PPO powder of PPO-2a has a number average molecular weight (Mn) of 2074 and a weight average molecular weight (Mw) of 5740.

A compound of Formula 2a:

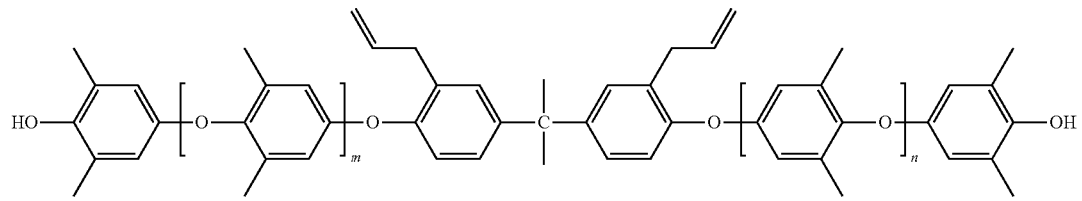

The value of m+n of the chemical formula of PPO-2a approaches 12.

Synthesis Example 2

The PPO prepared in this synthesis example is referred to herein as PPO-2b. 150 mL of toluene, 0.25 g of copper chloride and 5.3 g of pyridine are added into a one-liter reaction kettle with four necks to prepare a metal composite catalyst.

54.9 g of 2,6-dimethylphenol and 15.4 g of 2,2'-diallyl bisphenol A are prepared as a methanol solution at a mass concentration of 50%.

Oxygen is bubbled through, and the reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Figure 2:
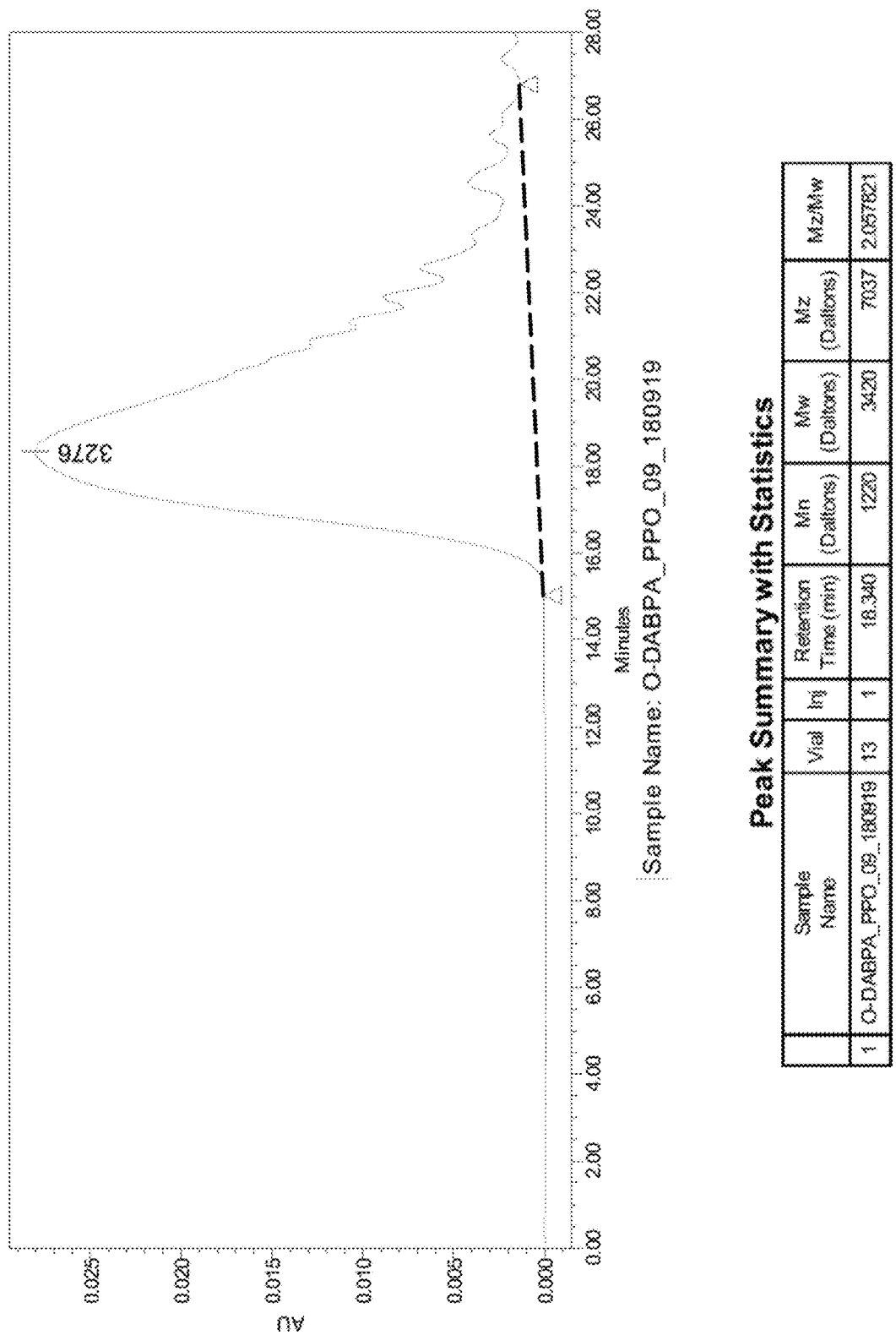
FIG. 2 is a GPC analysis result of Synthesis Example 2 of the present invention.

Finally, the product is washed with methanol and the filter cake is dried under vacuum at 110° C. for 4 hours to obtain 58 g of a PPO powder of the following formula 2b. According to a GPC analysis result shown in FIG. 2, the PPO powder of PPO-2b has a number average molecular weight (Mn) of 1220 and a weight average molecular weight (Mw) of 3420.

A compound of Formula 2b:

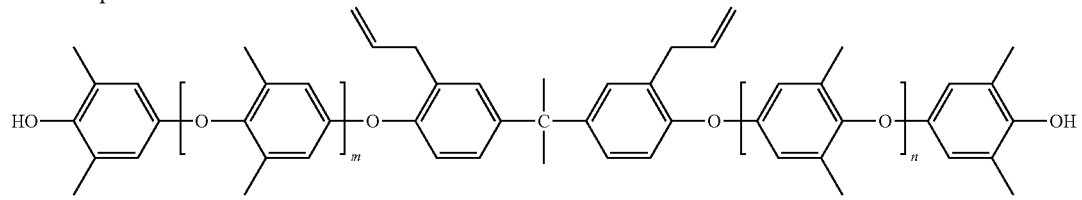

The value of m+n of the chemical formula of PPO-2b approaches 7.

Synthesis Example 3

The PPO prepared in this synthesis example is referred to herein as PPO-2c. 150 mL of toluene, 0.25 g of copper chloride and 5.3 g of pyridine are added into a one-liter reaction kettle with four necks to prepare a metal composite catalyst.

51.2 g of 2,6-dimethylphenol and 21.5 g of 2,2'-diallyl bisphenol A are prepared as a methanol solution at a mass concentration of 50%.

Oxygen is bubbled through, and the reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Figure 3:
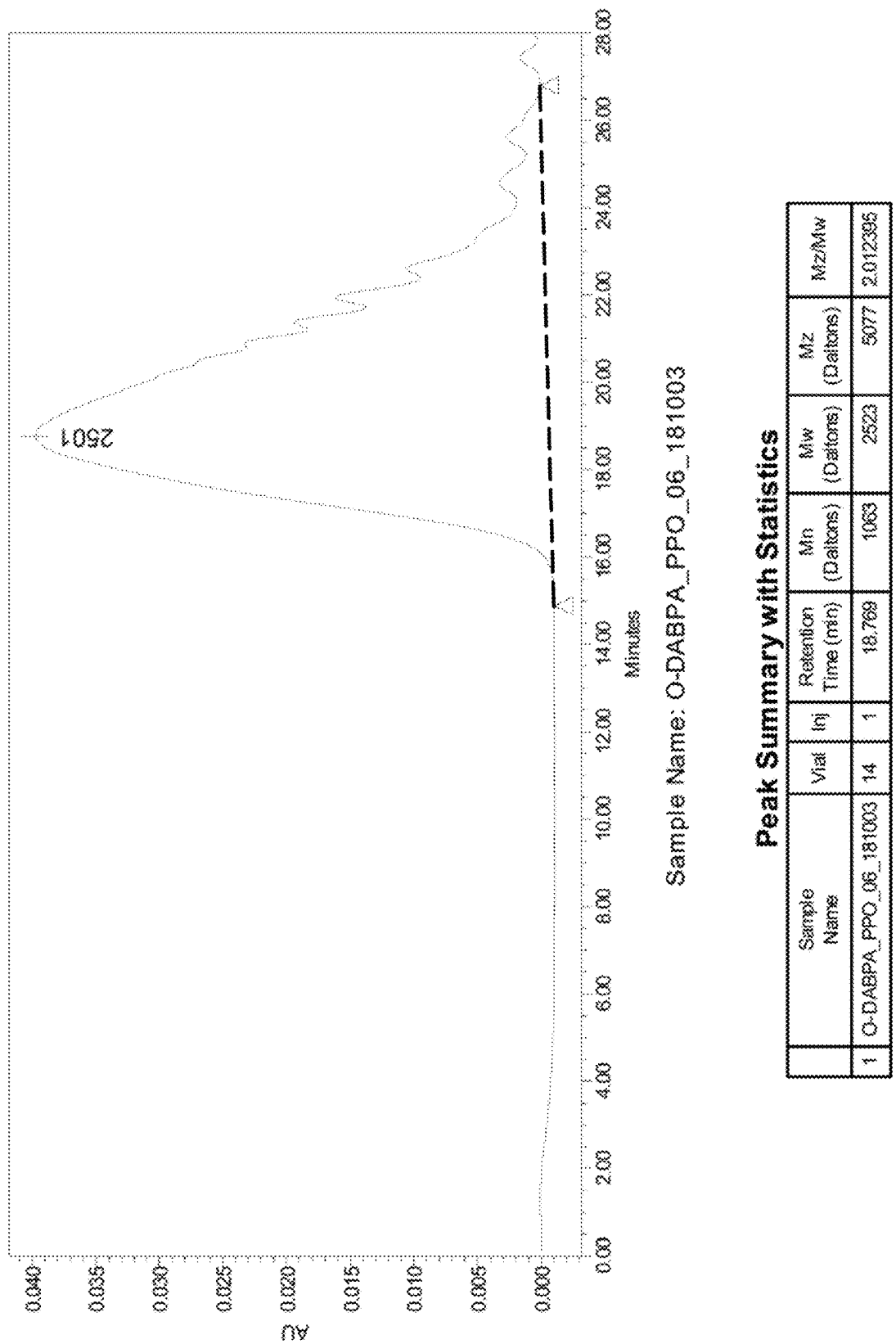
FIG. 3 is a GPC analysis result of Synthesis Example 3 of the present invention.

Finally, the product is washed with methanol and the filter cake is dried under vacuum at 110° C. for 4 hours to obtain 57 g of a PPO powder of the following formula 2c. According to a GPC analysis result as shown in FIG. 3, the PPO powder of PPO-2c has a number average molecular weight (Mn) of 1063 and a weight average molecular weight (Mw) of 2523.

A compound of Formula 2c:

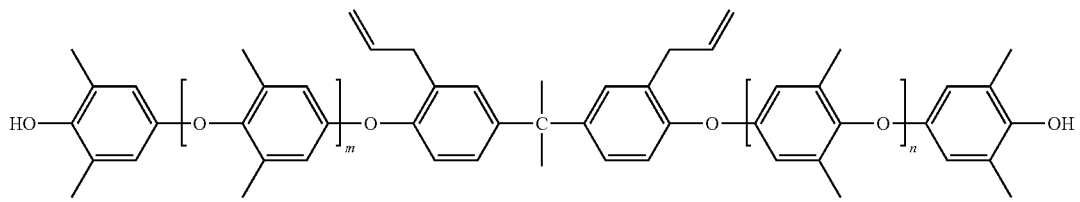

The value of m+n of the chemical formula of PPO-2c approaches 4.

Synthesis Example 4

The PPO prepared in this synthesis example is referred to herein as PPO-2d. 150 mL of toluene, 0.25 g of copper chloride and 5.3 g of pyridine are added into a one-liter reaction kettle with four necks to prepare a metal composite catalyst.

59.8 g of 2,6-dimethylphenol and 14.5 g of O-dipropylenecyclopentadienol resin are prepared as a methanol solution at a mass concentration of 50%.

Oxygen is bubbled through, and the reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Figure 4:
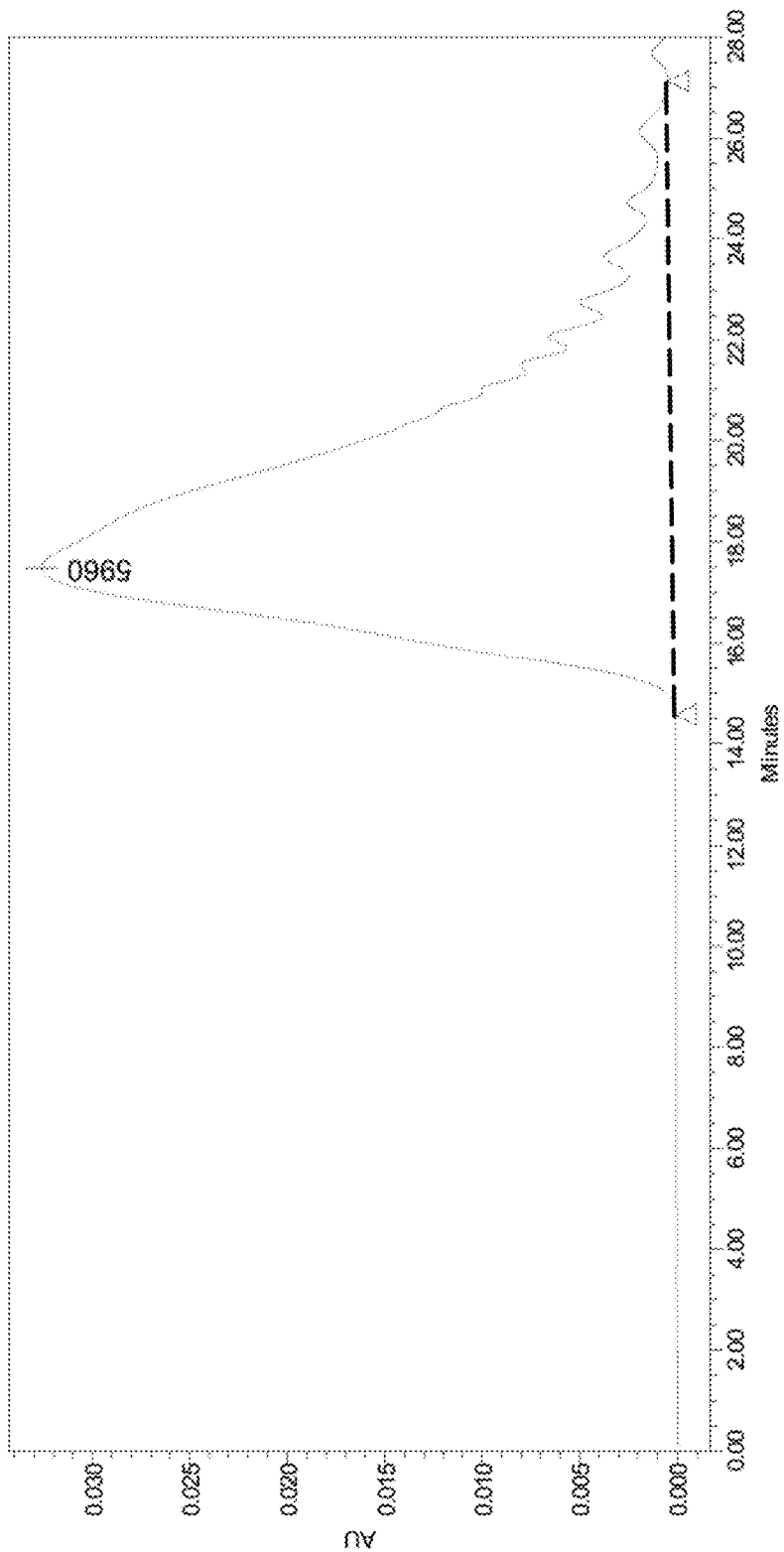
FIG. 4 is a GPC analysis result of Synthesis Example 4 of the present invention.

Finally, the product is washed with methanol and the filter cake is dried under vacuum at 110° C. for 4 hours to obtain 63 g of a PPO powder of the following formula 2d. According to a GPC analysis result as shown in FIG. 4, the PPO powder of PPO-2d has a number average molecular weight (Mn) of 1530 and a weight average molecular weight (Mw) of 5614.

A compound of Formula 2d:

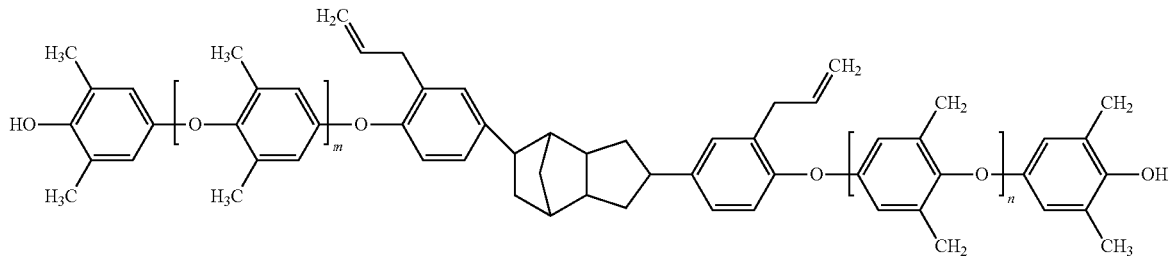

The value of m+n of the chemical formula of PPO-2d approaches 12.

Synthesis Example 5

The PPO prepared in this synthesis example is referred to herein as PPO-2e. 150 mL of toluene, 0.25 g of copper chloride and 5.3 g of pyridine are added into a four-necked one-liter reaction kettle to prepare a metal composite catalyst.

59.8 g of 2,6-dimethylphenol and 14.6 g of 2,2'-diallyl hexafluorobisphenol A are prepared as a methanol solution at a mass concentration of 50%.

Oxygen is bubbled through, and the reaction is then performed for 120 minutes under a controlled temperature between 30° C. and 35° C. At the end of the reaction, 1.05 g of 36.5 wt % hydrochloric acid is added and stirred for 30 minutes, and 500 mL of methanol is added for precipitation of a product.

Figure 5:
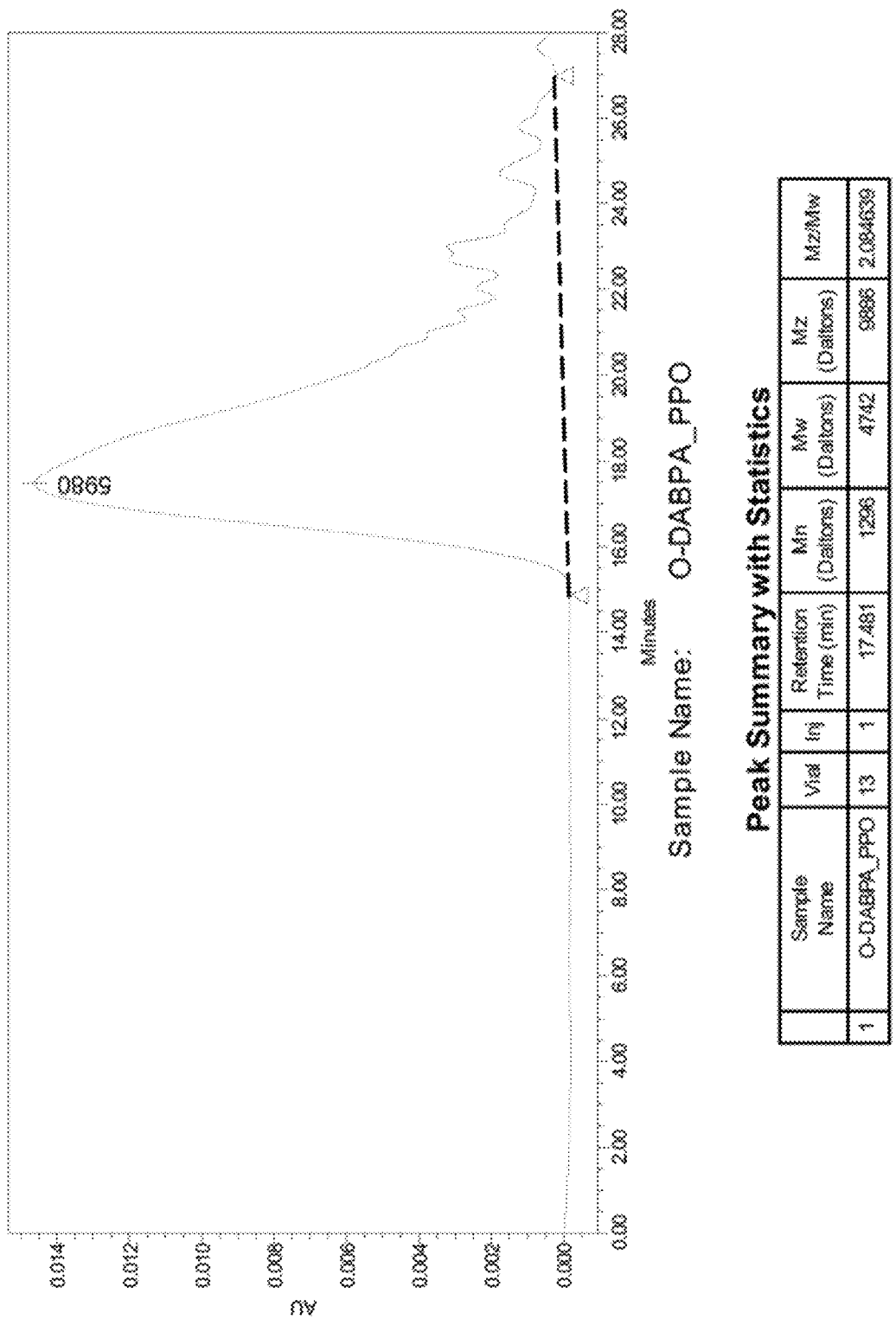
FIG. 5 is a GPC analysis result of Synthesis Example 5 of the present invention.

Finally, the product is washed with methanol and the filter cake is dried under vacuum at 110° C. for 4 hours to obtain 55 g of a PPO powder of the following formula 2e. According to a GPC analysis result as shown in FIG. 5, the PPO powder PPO-2e has a number average molecular weight (Mn) of 1296 and a weight average molecular weight (Mw) of 4742.

A compound of Formula 2e:

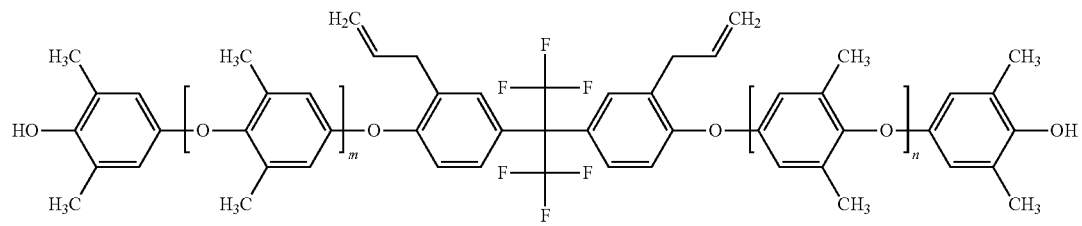

The value of m+n of the chemical formula of PPO-2e approaches 12.

Synthesis Example 6

The PPO prepared in this synthesis example is referred to herein as PPO-2f. 200 mL of cyclohexanone and 61 g of the PPO powder obtained in Synthesis Example 1 are added into a one-liter reaction kettle with four necks; the mixture is stirred and warmed to 40° C. such that the PPO powder is dissolved; and 15.9 g of propylene chloride is then added. The temperature is controlled to 40° C., and 5.6 g of a 50 wt % aqueous solution of NaOH is added within 30 minutes, warmed to 70° C. and reacted for 200 minutes; and the temperature is increased to 100° C. under reduced pressure to remove water and excess propylene chloride.

Figure 6:
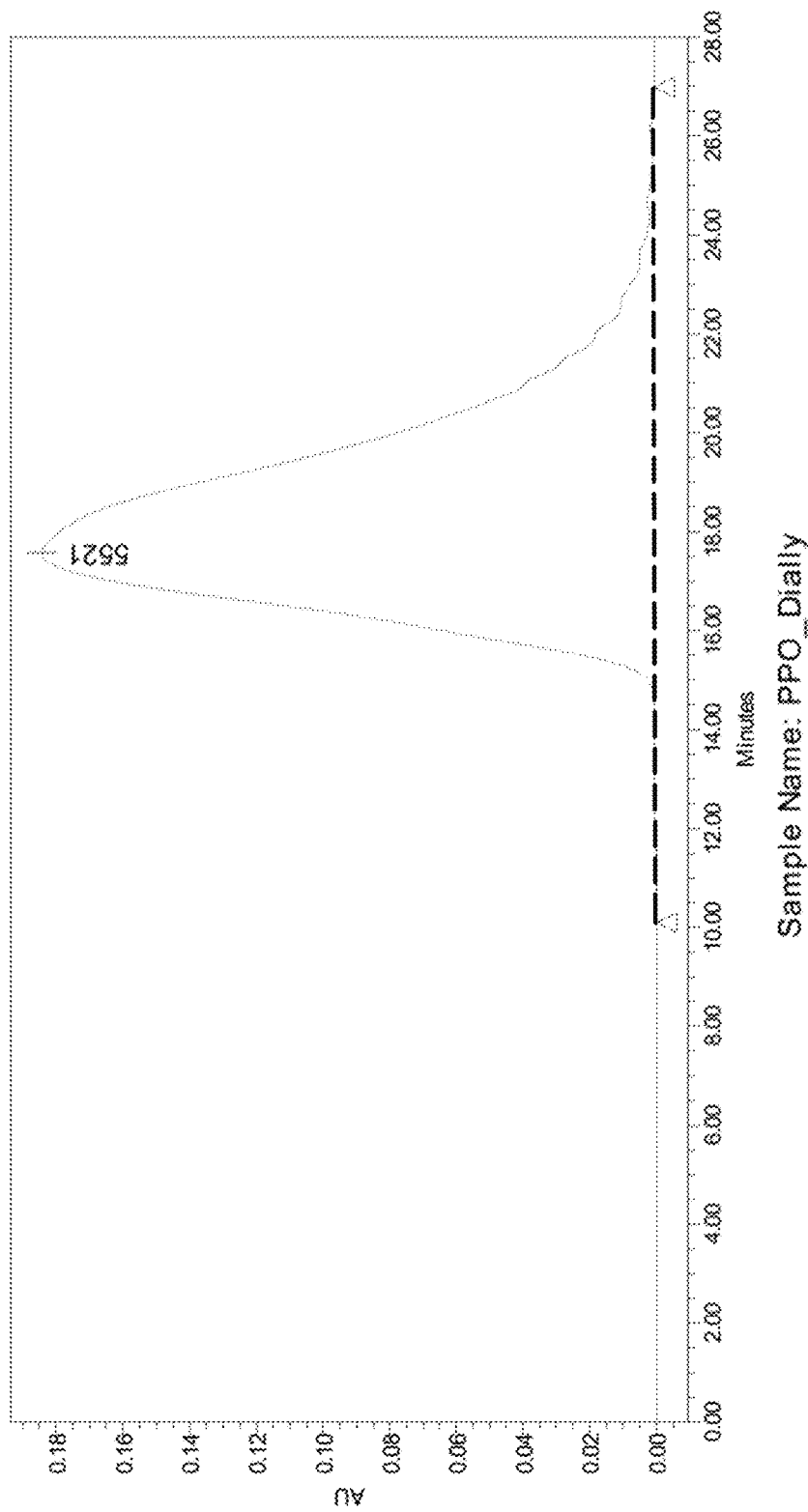
FIG. 6 is a GPC analysis result of Synthesis Example 6 of the present invention.

The product is washed with water and warmed to 150° C. under reduced pressure to remove cyclohexane, thereby obtaining 63 g of a multifunctional PPO resin of the following formula 2f. According to a GPC analysis result as shown in FIG. 6, the multifunctional PPO resin PPO-2f has a number average molecular weight (Mn) of 2206 and a weight average molecular weight (Mw) of 5924.

A compound of Formula 2f:

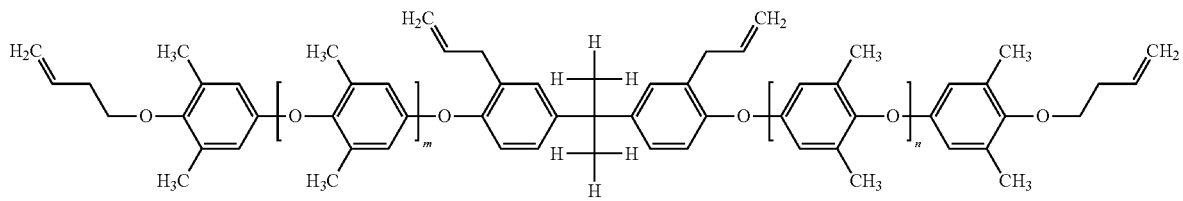

The value of m+n of the chemical formula of PPO-2f approaches 12.

Synthesis Example 7

The PPO prepared in this synthesis example is referred to herein as PPO-2g. 200 mL of cyclohexanone and 61 g of PPO powder obtained in Synthesis Example 4 are added into a one-liter reaction kettle with four necks; the mixture is stirred and warmed to 40° C. such that the PPO powder is dissolved; and 15.9 g of propylene chloride is then added. The temperature is controlled to 40° C., and 5.6 g of a 50 wt % aqueous solution of NaOH is added within 30 minutes, warmed to 70° C. and reacted for 200 minutes; and the temperature is increased to 100° C. under reduced pressure to remove water and excess propylene chloride.

Figure 7:
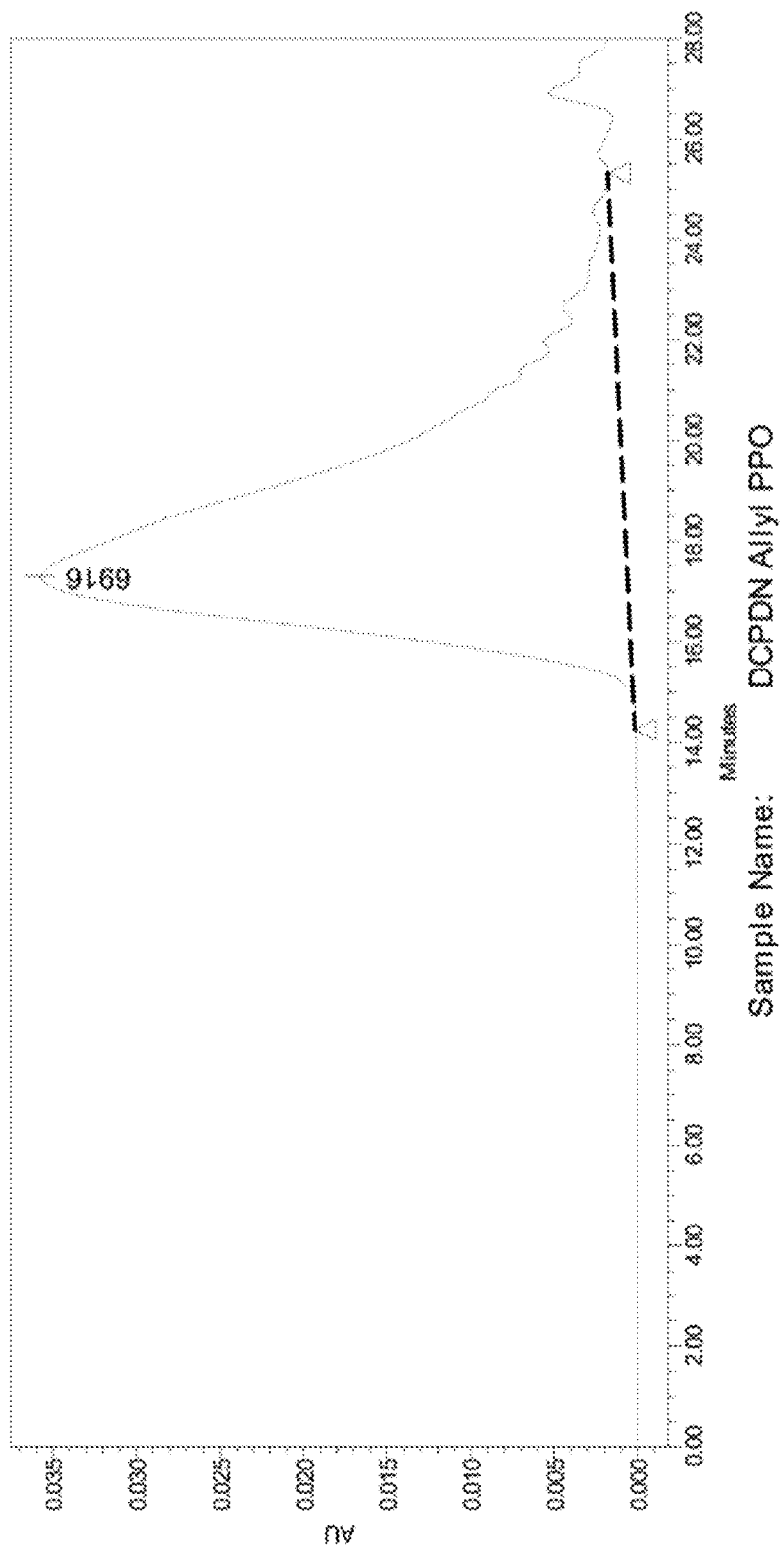
FIG. 7 is a GPC analysis result of Synthesis Example 7 of the present invention.

The product is washed with water and warmed to 150° C. under reduced pressure to remove cyclohexane, thereby obtaining 64 g of a multifunctional PPO resin of the following formula 2g. According to a GPC analysis result as shown in FIG. 7, the multifunctional PPO resin as PPO-2g has a number average molecular weight (Mn) of 2139 and a weight average molecular weight (Mw) of 6050.

A compound of Formula 2g:

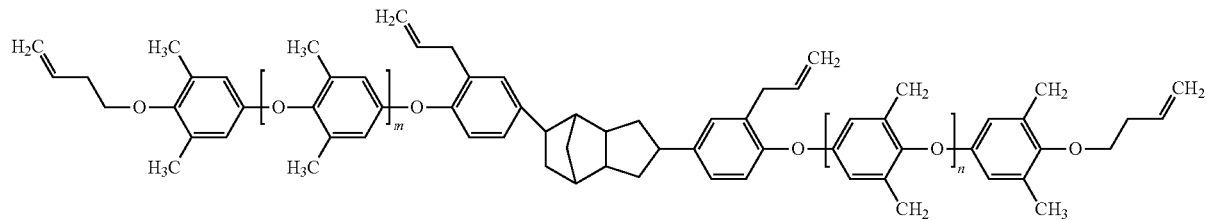

The value of m+n of the chemical formula of PPO-2g approaches 12.

Synthesis Example 8

The PPO prepared in the synthesis example is referred to herein as PPO-2h. 200 mL of cyclohexanone and 55 g of PPO powder obtained in synthesis example 5 are added into a one-liter reaction kettle with four necks; the mixture is stirred and warmed to 40° C. such that the PPO powder is dissolved; and 15.1 g of propylene chloride is then added. The temperature is controlled to 40° C., and 5.4 g of a 50 wt % aqueous solution of NaOH is added within 30 minutes, warmed to 70° C. and reacted for 200 minutes; and the temperature is raised to 100° C. under reduced pressure to remove water and excess propylene chloride.

Figure 8:
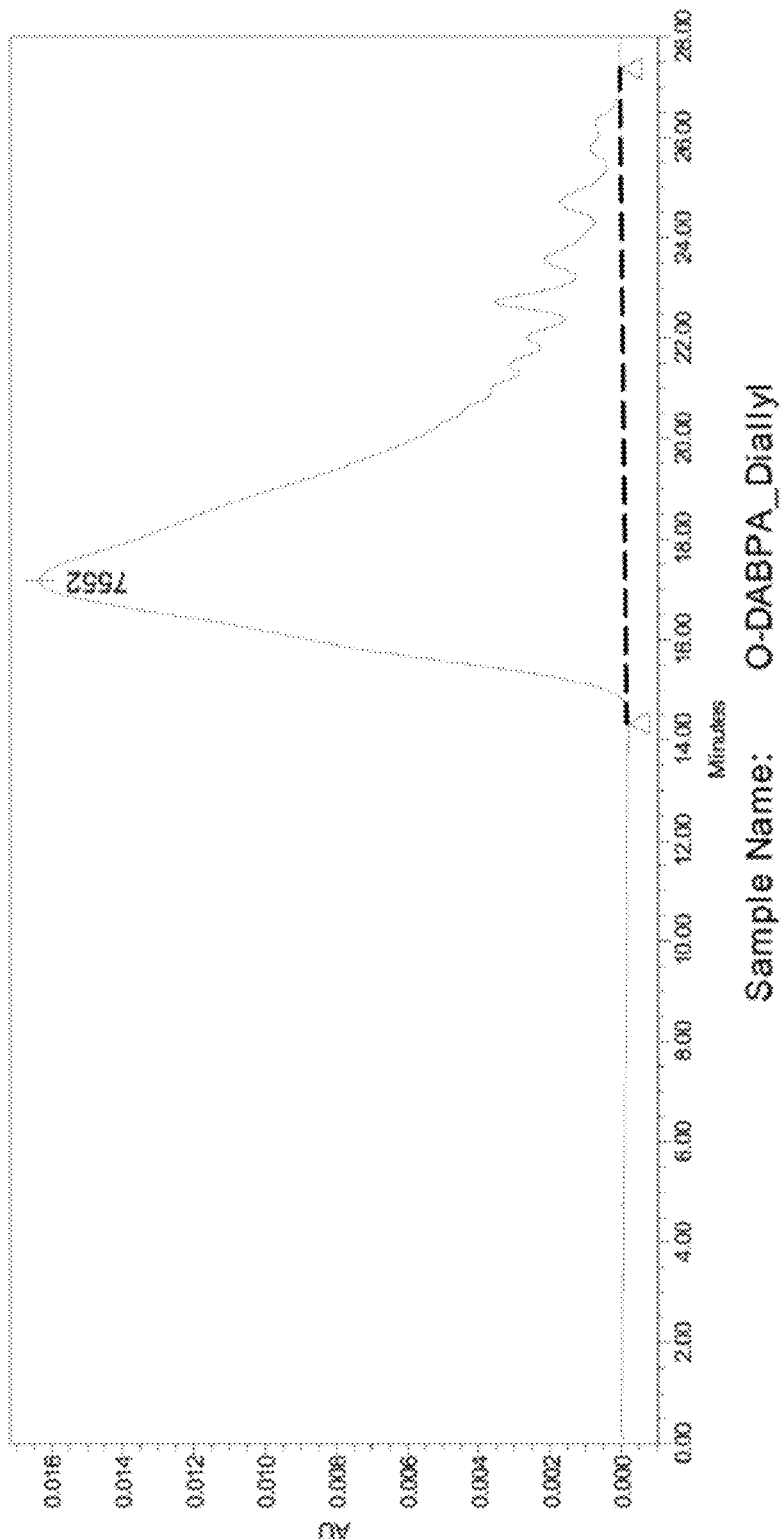
FIG. 8 is a GPC analysis result of Synthesis Example 8 of the present invention.

The product is washed with water and warmed to 150° C. under reduced pressure to remove cyclohexane, thereby obtaining 56 g of a multifunctional PPO resin of the following formula 2h. According to a GPC analysis result as shown in FIG. 8, the multifunctional PPO resin as PPO-2h has a number average molecular weight (Mn) of 1443 and a weight average molecular weight (Mw) of 6991.

A compound of Formula 2h:

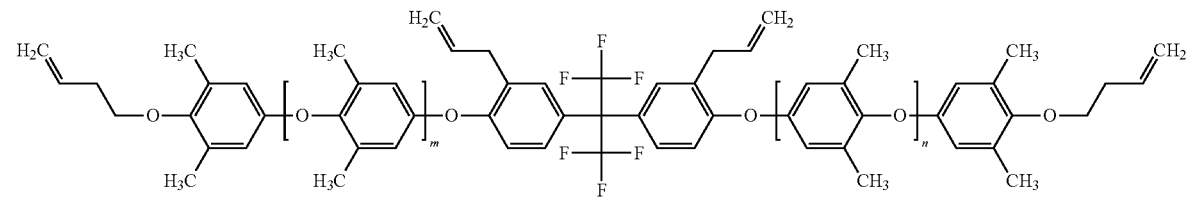

The value of m+n of the chemical formula of PPO-2h approaches 12.

PPO-2a to PPO-2h of Synthesis Examples 1 to 8 are prepared into a substrate respectively according to the formulation of Table 7, and compared with Comparative Examples 5 to 6, and the test results are shown in Table 8. According to the formulation of Table 7, PPO-2a to PPO-2h of synthesis examples 1 to 8 are further mixed with BMI resin, triallyl isocyanurate (TAIC), and benzoyl peroxide (BPO) to prepare a substrate.

TABLE 7

(Unit: g)

| | Synthesis Example | | | | | | | | Comparative Example | |
|---|---|---|---|---|---|---|---|---|---|---|
| | 1 | 2 | 3 | 4 | 5 | 6 | 7 | 8 | 5 | 6 |
| PPO-2a | 40 | — | — | — | — | — | — | — | — | — |
| PPO-2b | — | 40 | — | — | — | — | — | — | — | — |
| PPO-2c | — | — | 40 | — | — | — | — | — | — | — |
| PPO-2d | — | — | — | 40 | — | — | — | — | — | — |
| PPO-2e | — | — | — | — | 40 | — | — | — | — | — |
| PPO-2f | — | — | — | — | — | 40 | — | — | — | — |
| PPO-2g | — | — | — | — | — | — | 40 | — | — | — |
| PPO-2h | — | — | — | — | — | — | — | 40 | — | — |
| PPO (MX-9000) | — | — | — | — | — | — | — | — | 40 | — |
| PPO (OPE-2ST) | — | — | — | — | — | — | — | — | — | 40 |
| BMI | 5 | 5 | 5 | 5 | 5 | 5 | 5 | 5 | 5 | 5 |
| TAIC | 32.5 | 32.5 | 32.5 | 32.5 | 32.5 | 12.5 | 12.5 | 12.5 | 32.5 | 32.5 |
| BPO | 2.5 | 2.5 | 2.5 | 2.5 | 2.5 | 2.5 | 2.5 | 2.5 | 2.5 | 2.5 |
| $SiO_2$ | 20 | 20 | 20 | 20 | 20 | 20 | 20 | 20 | 20 | 20 |

TABLE 8

| | Synthesis Example | | | | | | | | Comparative Example | |
|---|---|---|---|---|---|---|---|---|---|---|
| | 1 | 2 | 3 | 4 | 5 | 6 | 7 | 8 | 5 | 6 |
| Tg (° C.) | 182 | 178 | 175 | 186 | 171 | 182 | 178 | 175 | 186 | 171 |
| Td (5%, ° C.) | 415 | 417 | 415 | 411 | 405 | 415 | 417 | 415 | 411 | 405 |
| T-288 (min) | >120 | >120 | >120 | >120 | >120 | >120 | >120 | >120 | >120 | >120 |
| Dk (10 GHz) | 3.96 | 3.98 | 3.92 | 3.84 | 3.89 | 3.96 | 3.98 | 3.92 | 3.84 | 3.89 |
| Df (10 GHz) | 0.0055 | 0.0058 | 0.0060 | 0.0053 | 0.0050 | 0.0055 | 0.0058 | 0.0060 | 0.0053 | 0.0050 |

BMI resins, fillers, flame retardants, or catalysts used in the present invention are not limited to the materials described in the above table. For example, the above examples use $SiO_2$ as a filler, however, inorganic fillers such as talc, aluminosilicate, and the like are also suitable for using. In addition, according to the comparison of the above examples, BZ-1 resin and BZ-2 resin with a functional group reactive with the double bond of PPO have a good electrical property and process ability, since becoming a thermosetting resin material by matching with BMI, PPO resins of the present invention, and PPO resin MX-9000 or OPE-2ST used commercially. Since the resin of the present invention is a stable homogeneous solution in a low boiling point solvent, the substrate material prepared from the solution, as shown in Tables above, has high glass transition temperature (Tg), high dielectric properties, low expansion coefficient, low water absorption, high impact resistance and high thermal conductivity, and is suitable for use as a substrate material for packaging electronic components or integrated circuits.

Moreover, in an example, the resin further comprises a PPO resin, a BZ resin comprising a crosslinkable functional group, and a BMI resin represented by the following Formula 4.

A compound of Formula 4:

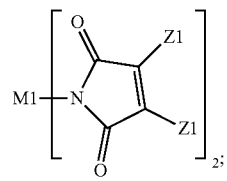

wherein M1 is substituted or unsubstituted methylene, 4,4'-diphenylmethane, m-phenylene, bisphenol A diphenyl ester, 3,3'-dimethyl-5,5'-diethyl-4,4'-diphenyl methane, 4-methyl-1,3-phenylene, (2,2,4-trimethyl) hexane, and each Z1 is independently H, halogen, or C1 to C5 alkyl.

According to the above examples, PPO resin mentioned by the present example is used in combination with the BZ resin of Formula 2 or Formula 3, but is not limited in the present invention. Any BZ resin comprising a crosslinkable functional group may be used in combination with the PPO resin mentioned by the present invention.

In addition, at least one of an elastomer, a catalyst, a flame retardant, a filler, a dispersant, a toughening agent and the like are further included in the resin as an additive. The flame retardants suitable for use in the present invention include phosphorus-containing flame retardants, bromine-containing flame retardants, or combinations thereof; the filler can be silicon dioxide, aluminum oxide, magnesium oxide, magnesium hydroxide, calcium carbonate, talc, clay, aluminum nitride, boron nitride, aluminum hydroxide, aluminum silicon carbide, silicon carbide, sodium carbonate, titanium dioxide, zinc oxide, zirconium oxide, quartz, diamond, diamond-like carbon, graphite, calcined kaolin, kaolin, mica, hydrotalcite, hollow silicon dioxide, polytetrafluoroethylene (PTFE) powder, glass beads, ceramic whiskers, carbon nanotubes or nano inorganic powder; the elastomer may be selected from polybutadiene, polyisoprene and styrene-containing polymers; catalysts may be dicumyl peroxide, α,α'-bis(t-butylperoxy)diisopropyl benzene, or benzoyl peroxide (BPO).

What is claimed is:

1. A resin, comprising a compound of the following Formula A:

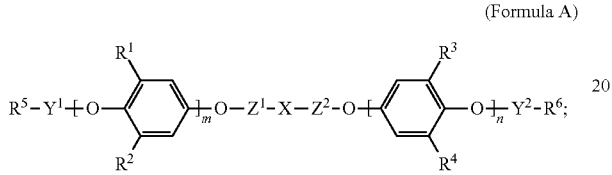

(Formula A)

a bismaleimide (BMI) resin;
a benzoxazine (BZ) resin; and
a flame retardant, wherein the flame retardant is an organic hypophosphinate-based compound or a cyclic phenoxyphosphazene,
wherein $Y^1$ and $Y^2$ each independently include

a group comprising an alkenyl group, a substituted or unsubstituted aromatic ring or at least include a combination of any one of the above;
$R^1$ to $R^4$ each independently include H, a substituted or unsubstituted aromatic ring, a substituted or unsubstituted C1 to C5 alkyl group, and a substituted or unsubstituted C2 to C5 alkenyl group, or at least include a combination of any one of the above;
$Z^1$ and $Z^2$ each independently include

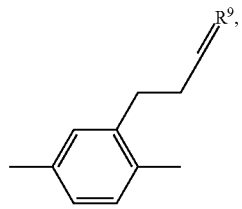

wherein $R^9$ comprises $CH_2$;
m and n each independently ranges from 4 to 100;
$R^5$ and $R^6$ each independently include H,

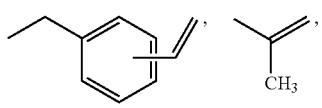

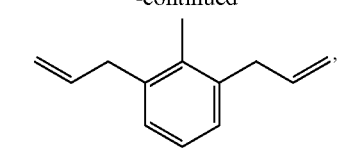

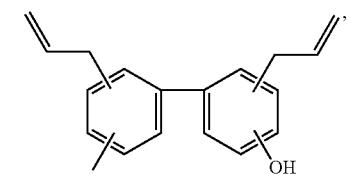

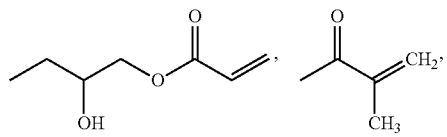

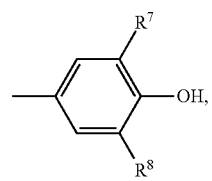

or at least include a combination of any one of the above;
X includes

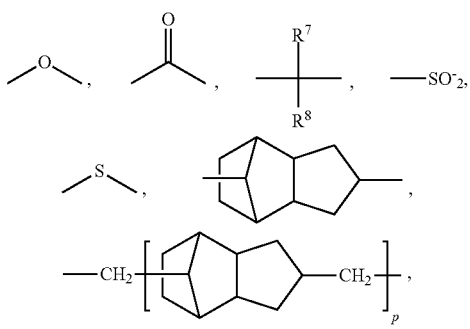

or at least includes a combination of any one of the above, p being a positive integer; and $R^7$ and $R^8$ each independently include H, C1 to C12 alkyl, or $CF_3$, or at least include a combination of any one of the above.

2. The resin according to claim 1, wherein the compound of Formula A has a number average molecular weight (Mn) of between 1000 and 15000, and a weight average molecular weight (Mw) of between 1000 and 25000.

3. A copper clad laminate (CCL), made of the resin according to claim 1.

4. A printed circuit board, comprising the copper clad laminate according to claim 3.

5. A resin, comprising a compound of the following Formula B:

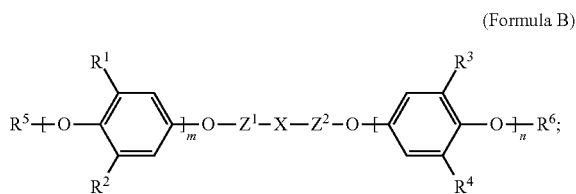
(Formula B)

a bismaleimide (BMI) resin;
a benzoxazine (BZ) resin; and
a flame retardant, wherein the flame retardant is an organic hypophosphinate-based compound or a cyclic phenoxyphosphazene,
wherein $R^1$ to $R^4$ each independently include H, a substituted or unsubstituted aromatic ring, a substituted or unsubstituted C1 to C5 alkyl group, and a substituted or unsubstituted C2 to C5 alkenyl group, or at least include a combination of any one of the above;
$Z^1$ and $Z^2$ each independently include

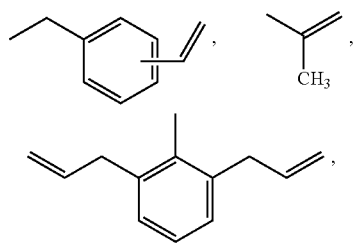

wherein $R^9$ comprises $CH_2$;
m and n are each independently a positive integer from 4 to 100;
$R^5$ and $R^6$ each independently include H,

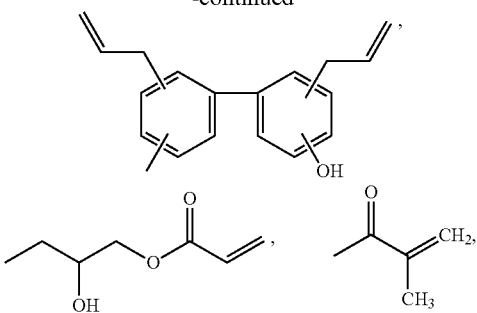

or at least include a combination of any one of the above;
X includes

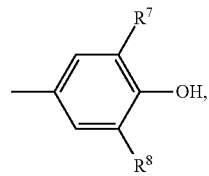

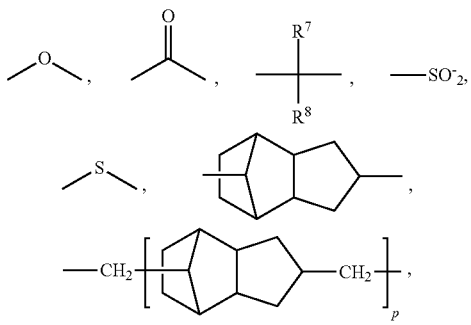

or at least includes a combination of any one of the above, p being a positive integer; and
$R^7$ and $R^8$ independently include H, C1 to C12 alkyl, or $CF_3$, or at least include a combination of any one of the above.

6. The resin according to claim 5, wherein the compound of Formula B has a number average molecular weight (Mn) of between 1000 and 15000, and a weight average molecular weight (Mw) of between 1000 and 25000.

7. A copper clad laminate (CCL), made of the resin according to claim 5.

8. A printed circuit board, comprising the copper clad laminate according to claim 7.

* * * * *